(12) United States Patent
Lee et al.

(10) Patent No.: US 11,912,887 B2
(45) Date of Patent: Feb. 27, 2024

(54) ANTI-FINGERPRINT COATING COMPOUND, DISPLAY PROTECTIVE LAYER INCLUDING SAME, AND ELECTRONIC APPARATUS INCLUDING DISPLAY PROTECTIVE LAYER

(71) Applicant: SAMSUNG DISPLAY CO., LTD., Yongin-si (KR)

(72) Inventors: Kangwoo Lee, Yongin-si (KR); Youngdo Kim, Yongin-si (KR); Aely Oh, Yongin-si (KR); Jonghwan Cho, Yongin-si (KR); Seongsik Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 237 days.

(21) Appl. No.: 17/468,956

(22) Filed: Sep. 8, 2021

(65) Prior Publication Data
US 2022/0227953 A1    Jul. 21, 2022

(30) Foreign Application Priority Data

Jan. 19, 2021 (KR) .................. 10-2021-0007677

(51) Int. Cl.
| | |
|---|---|
| C09D 171/00 | (2006.01) |
| C09D 183/06 | (2006.01) |
| C08J 7/04 | (2020.01) |
| C08J 7/046 | (2020.01) |
| C09D 5/16 | (2006.01) |
| C08G 77/46 | (2006.01) |

(52) U.S. Cl.
CPC .......... *C09D 171/00* (2013.01); *C08G 77/46* (2013.01); *C08J 7/042* (2013.01); *C08J 7/046* (2020.01); *C09D 5/1662* (2013.01); *C09D 183/06* (2013.01); *C08J 2367/02* (2013.01); *C08J 2423/26* (2013.01); *C08J 2483/06* (2013.01); *C09D 5/1693* (2013.01)

(58) Field of Classification Search
CPC ........................... C08G 65/226; C08G 65/336
See application file for complete search history.

(56) References Cited

U.S. PATENT DOCUMENTS

| | | | |
|---|---|---|---|
| 6,841,190 B2 * | 1/2005 | Liu | C08F 290/06 427/407.1 |
| 8,211,544 B2 | 7/2012 | Itami et al. | |
| 10,533,071 B2 | 1/2020 | Tonelli et al. | |
| 10,781,335 B2 | 9/2020 | Yamashita et al. | |
| 2017/0349760 A1 * | 12/2017 | Friedrich | C07F 7/1804 |
| 2018/0346751 A1 | 12/2018 | Kim et al. | |
| 2020/0002554 A1 * | 1/2020 | Miyamoto | C08G 18/8116 |
| 2020/0117029 A1 | 4/2020 | Sung | |
| 2020/0157376 A1 | 5/2020 | Hoshino et al. | |
| 2020/0235340 A1 | 7/2020 | Oh et al. | |

FOREIGN PATENT DOCUMENTS

| | | |
|---|---|---|
| CN | 111057231 | 4/2020 |
| JP | 2016-1320 | * 1/2016 |
| JP | 2017-535661 | 11/2017 |
| KR | 10-2007-0118285 | 12/2007 |
| KR | 10-2017-0106781 | 9/2017 |
| KR | 10-2020-0033366 | 3/2020 |
| KR | 10-2020-0040953 | 4/2020 |
| KR | 10-2020-0041042 | 4/2020 |
| KR | 10-2020-0043366 | 4/2020 |
| WO | 2016032738 | 3/2016 |
| WO | 2018079525 | 5/2018 |
| WO | WO 2019151445 | * 8/2019 |
| WO | 2019208503 | 10/2019 |

OTHER PUBLICATIONS

Machine translation of JP 2016-1320 into English (no date).*
Machine translation of JP 2016-1320 (no date).*
Machine translation of WO 2019/151445 (no date).*
PCT International Search Report dated Jan. 26, 2022 in corresponding Korean Patent Application No. 10-2021-014495 (in Korean) (4 pages).
Glaeser, "Friction and Wear", IEEE Transactions on Parts, Hybrids, and Packaging, vol. PHP-7, No. 2, Jun. 1971, pp. 99-105.
Ahn, et al., "Adsorption characteristics of silane-functionalized perfluoropolyether on hydroxylated glassy silica surfaces: A multiscale approach", Applied Surface Science 496 (2019) 143699, 7 pages.
Lyu, et al., "Preparation and characterization of POSS-containing poly(perfluoropolyether)methacrylate hybrid copolymer and its superhydrophobic coating performance", RSC Advances, 2019, 9, pp. 4765-4770.

* cited by examiner

*Primary Examiner* — Marc S Zimmer
(74) *Attorney, Agent, or Firm* — F. CHAU & ASSOCIATES, LLC

(57) ABSTRACT

Provided is an anti-fingerprint coating compound including a top portion, a linker, and an end portion, in which the top portion includes two or three perfluoropolyether moieties, the linker linking the top portion to the end portion is a trivalent or tetravalent linking group, and the end portion includes a siloxane moiety.

19 Claims, 3 Drawing Sheets

ANTI-FINGERPRINT COATING COMPOUND, DISPLAY PROTECTIVE LAYER INCLUDING SAME, AND ELECTRONIC APPARATUS INCLUDING DISPLAY PROTECTIVE LAYER

CROSS-REFERENCE TO RELATED APPLICATION

This application claims priority under 35 U.S.C. § 119 to Korean Patent Application No. 10-2021-0007677, filed on Jan. 19, 2021, in the Korean Intellectual Property Office, the disclosure of which is incorporated by reference herein in its entirety.

TECHNICAL FIELD

The present disclosure relates to an anti-fingerprint coating compound, a display protective layer including the same, and an electronic apparatus.

DISCUSSION OF RELATED ART

Organic light-emitting devices (OLEDs) are self-emissive devices that, as compared with conventional electronic devices, have wide viewing angles, high contrast ratios, short response times, and excellent characteristics in terms of luminance, driving voltage, and response speed.

An OLED may include a first electrode (a hole injection electrode) located on a substrate, and a hole transport region, an emission layer, an electron transport region, and a second electrode (an electron injection electrode) sequentially stacked on the first electrode. Holes provided from the first electrode may move toward the emission layer through the hole transport region, and electrons provided from the second electrode may move toward the emission layer through the electron transport region. Carriers, such as holes and electrons, recombine in the emission layer to produce excitons. These excitons transition from an excited state to a ground state to thereby emit light. The image displayed by the OLED may be realized through the light emitting.

An electronic apparatus, to which an OLED is applied, uses a foldable polymer film in which a hard coating is applied to a window and a protective layer so as to secure folding characteristics.

SUMMARY

Embodiments of the present disclosure include an anti-fingerprint coating compound, a display protective layer including the same, and an electronic apparatus.

Additional aspects will be set forth in part in the description, which follows and, in part, will be apparent from the description, or may be learned by practice of the presented embodiments of the present disclosure.

According to an embodiment of the present disclosure, an anti-fingerprint coating compound includes a top portion, a linker, and an end portion, in which the top portion may include two or three perfluoropolyether moieties, the linker linking the top portion to the end portion may be a trivalent or tetravalent linking group, and the end portion may include a siloxane moiety.

According to an embodiment of the present disclosure, a display protective layer includes a substrate, a hard coating layer located on the substrate, and an anti-fingerprint coating layer located on the hard coating layer, in which the anti-fingerprint coating layer is a layer coated with anti-fingerprint coating compounds, each includes a top portion, a linker, and an end portion, and the top portion may include two or three perfluoropolyether moieties, the linker linking the top portion to the end portion may be a trivalent or tetravalent linking group, and the end portion may include a siloxane moiety.

According to an embodiment of the present disclosure, an electronic apparatus includes a display protective layer. The display protective layer includes a substrate, a hard coating layer located on the substrate, and an anti-fingerprint coating layer located on the hard coating layer, in which the anti-fingerprint coating layer is a layer coated with anti-fingerprint coating compounds, each includes a top portion, a linker, and an end portion, and the top portion may include two or three perfluoropolyether moieties, the linker linking the top portion to the end portion may be a trivalent or tetravalent linking group, and the end portion may include a siloxane moiety.

BRIEF DESCRIPTION OF THE DRAWINGS

The above and other aspects and features of embodiments of the present disclosure will be more apparent from the following description taken in conjunction with the accompanying drawings, in which.

Figure 1:
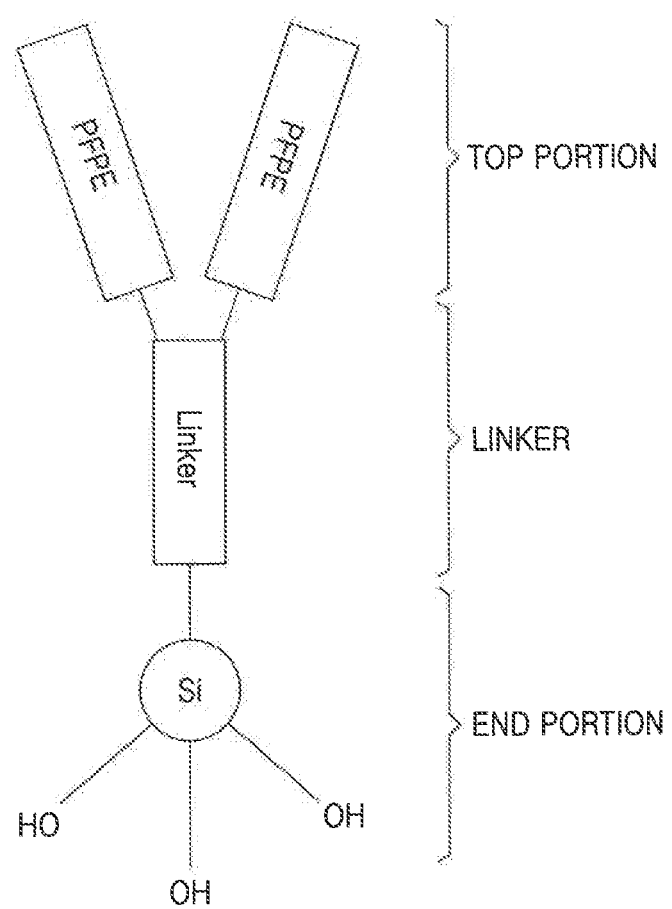
FIG. 1 shows a schematic view of an anti-fingerprint coating compound according to an embodiment of the present disclosure.
Figure 2:
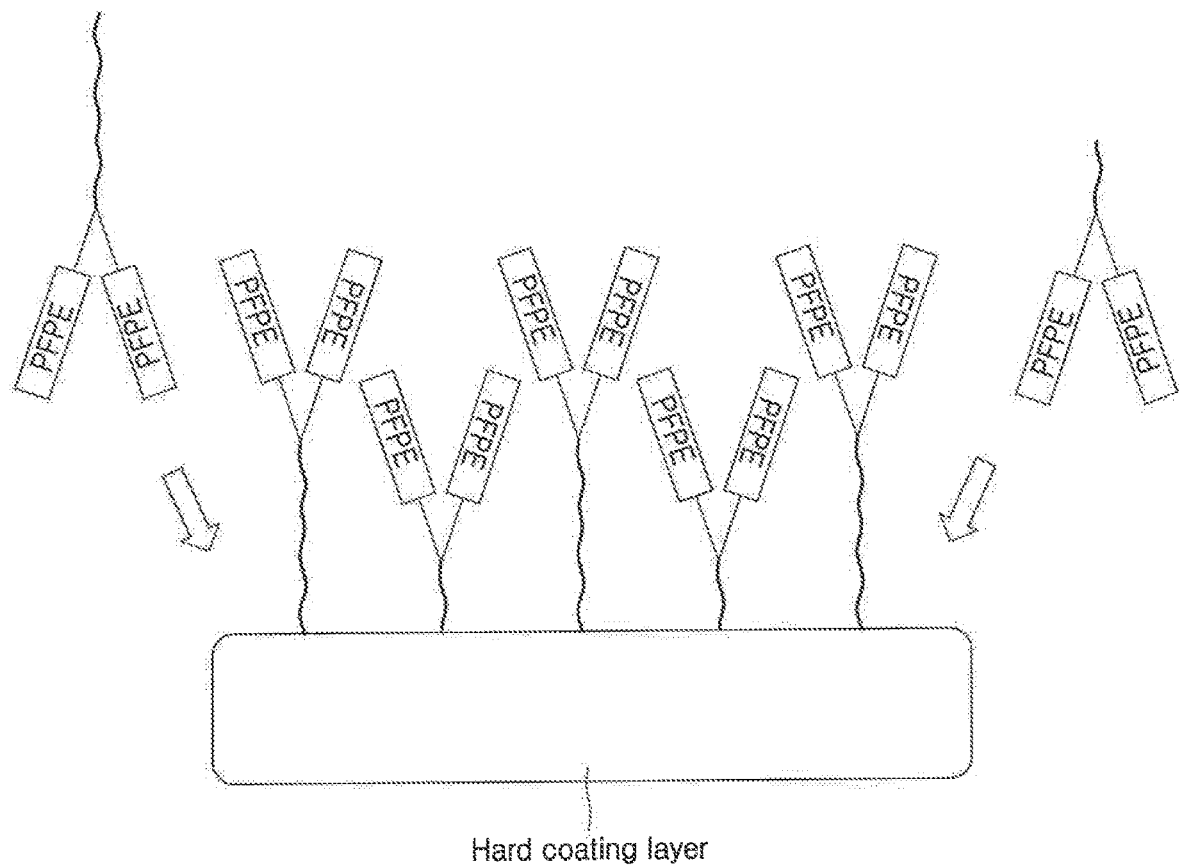
FIG. 2 is a schematic view of an anti-fingerprint coating layer having an uneven surface formed by coating an anti-fingerprint coating compound according to an embodiment of the present disclosure on a hard coating layer having a flat surface.
Figure 3:
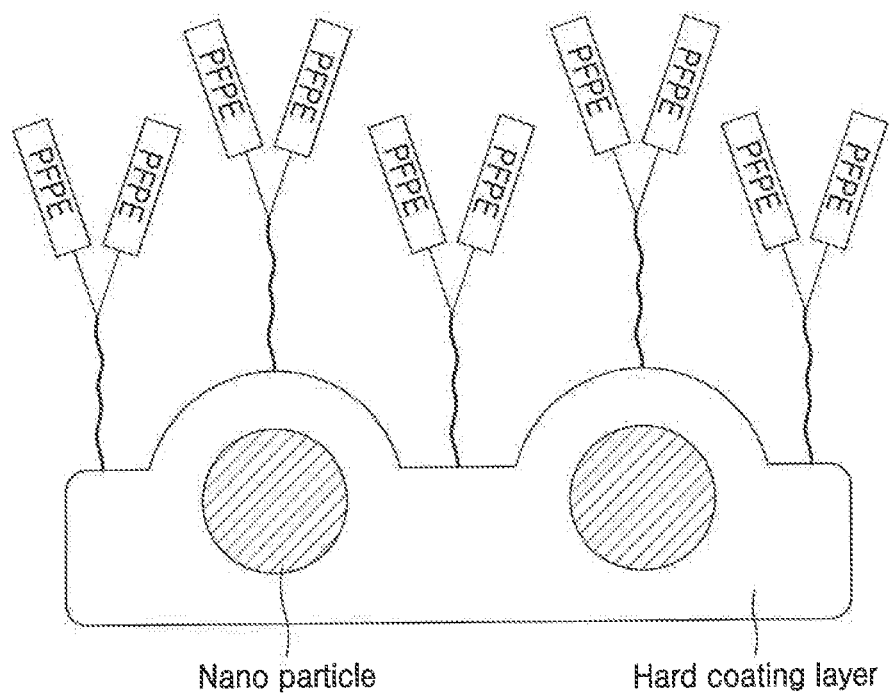
FIG. 3 is a schematic view of an anti-fingerprint coating layer having an uneven surface formed by coating an anti-fingerprint coating compound according to an embodiment of the present disclosure on a hard coating layer having an uneven surface.

Since the drawings in FIGS. 1-3 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Reference will now be made in detail to embodiments, examples of which are illustrated in the accompanying drawings, wherein like reference numerals refer to like elements throughout the specification. In this regard, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. The expression such as "at least one of A and B" may include A, B, or A and B.

When the term "about" is used in this specification in connection with a numerical value, it is intended that the associated numerical value includes a tolerance of up to ±10% around the stated numerical value.

Foldable products use a film in which a hard coating is applied to a window and a protective layer to secure folding characteristics. However, there is a limit to the increase in film thickness to secure folding characteristics, and the film is vulnerable to imprints and scratches caused by external impact. The scratch resistance of the hard coating is influenced not only by surface hardness but also by a type of abrasive material, friction coefficient, surface roughness, modulus and elasticity, environments, etc. To increase scratch resistance may be achieved by reducing friction, and to reduce the friction may be achieved by imparting hydrophobicity to the hard coating.

Although a soft protective layer such as polyethylene terephthalate (PET) is used to secure folding flexibility, wear resistance against repetitive touch is low, and recovery force from surface pressing due to nail pressing and pen-drop is small.

An anti-fingerprint coating compound according to an embodiment of the present disclosure may include a top portion, a linker, and an end portion, in which the top portion may include 2 or 3 perfluoropolyether (PFPE) moieties, the linker linking the top portion to the end portion may be a trivalent or tetravalent linking group, and the end portion may include a siloxane moiety.

The perfluoropolyether refers to a structure in which a unit, in which an alkyl group in which all H is substituted with F is bonded to O, is repeated.

According to an embodiment of the present disclosure, the perfluoropolyether moiety may be represented by Formula 1:

$$R_1O\text{---}(R_2O)_m\text{---}*$$  Formula 1 wherein, in Formula 1, $R_1$ represents a branched or linear $C_1$-$C_{60}$ alkyl group substituted with F, $R_2$ represents a branched or chain $C_1$-$C_{60}$ alkylene group substituted with F, m represents an integer from 1 to 20, when m is 2 or greater, respective $R_2$'s are identical to or different from each other, and

* denotes a binding site to a linker.

In an embodiment of the present disclosure, m may be an integer of 1 to 10. In an embodiment of the present disclosure, m may be an integer of 1 to 7. In an embodiment of the present disclosure, m may be an integer of 1 to 5.

In an embodiment of the present disclosure, the perfluoropolyether moiety may be, for example, $CF_3O$—$(C_2F_4O)_{m1}$—$(CF_2O)_{m2}$—*, $C_2F_5O$—$(C_2F_4O)_{m1}$—$(CF_2O)_{m2}$—*, $C_3F_7O$—$(C_2F_4O)_{m1}$—$(CF_2O)_{m2}$—*, $C_4F_9O$—$(C_2F_4O)_{m1}$—$(CF_2O)_{m2}$—*, $CF_3O$—$(C_3F_6O)_{m1}$—$(CF_2O)_{m2}$—*, $C_2F_5O$—$(C_3F_6O)_{m1}$—$(CF_2O)_{m2}$—*, $C_3F_7O$—$(C_3F_6O)_{m1}$—$(CF_2O)_{m2}$—*, $C_4F_9O$—$(C_3F_6O)_{m1}$—$(CF_2O)_{m2}$—*, $CF_3O$—$(C_2F_4O)_{m1}$—$(C_2F_4O)_{m2}$—*, $C_2F_5O$—$(C_2F_4O)_{m1}$—$(C_2F_4O)_{m2}$—*, $C_3F_7O$—$(C_2F_4O)_{m1}$—$(C_2F_4O)_{m2}$—*, or $C_4F_9O$—$(C_2F_4O)_{m1}$—$(C_2F_4O)_{m2}$—*. m1 and m2 may each be an integer from 0 to 10, and the sum of m1 and m2 may be from 1 to 10.

The fluoroalkyl or fluoroalkylene moiety having at least two carbon atoms (e.g., $C_2F_4$, $C_2F_5$, $C_3F_6$, $C_3F_7$, $C_4F_9$) may have a linear or branched structure.

According to an embodiment of the present disclosure, the linker may be represented by Formula 2:

$$*\text{---}\underset{\underset{*}{|}}{\overset{(*)_{n1}}{\underset{|}{C}}}(H)_{n2}\text{---}(R_{11}O)_{n3}\text{---}(R_{12})_{n4}\text{---}*'$$  Formula 2 wherein, in Formula 2, $R_{11}$ represents a $C_1$-$C_{60}$ alkylene group, and $R_{12}$ represents a $C_2$-$C_{60}$ heteroalkylene group, n1 and n2 may each independently represent an integer of 0 or 1, and the sum of n1 and n2 may be 1, n3 and n4 may each independently represent an integer from 1 to 10, when n3 is 2 or more, respective $R_{11}$'s may be identical to or different from each other, when n4 is 2 or more, respective $R_{12}$'s may be identical to or different from each other,

* represents a binding site to the top portion, and

*' represents a binding site to the end portion.

The $C_1$-$C_{60}$ alkylene group and the $C_2$-$C_{60}$ heteroalkylene group may each have an unsubstituted structure. For example, the $C_1$-$C_{60}$ alkylene group and the $C_2$-$C_{60}$ heteroalkylene group may each have a structure not substituted with F.

In an embodiment of the present disclosure, n3 and n4 may each independently be an integer of 1 to 8. In an embodiment of the present disclosure, n3 and n4 may each independently be an integer of 1 to 5.

The heteroalkylene group refers to an alkylene group including a hetero element other than carbon in a main chain thereof. The hetero element may be, for example, S, O, P, N, or a combination thereof. In an embodiment of the present disclosure, the $C_2$-$C_{60}$ heteroalkylene group included in the anti-fingerprint coating compound may include S, O, P, N, or a combination thereof.

According to an embodiment of the present disclosure, $R_{12}$ in Formula 2 may be a heteroalkylene group including N.

In an embodiment of the present disclosure, the linking group may be selected from the following moieties (1 to 14):

1

$$*\text{---}\underset{H}{\overset{*}{\underset{|}{C}}}\text{---}(CH_2O)_{n3}\text{---}(CH_2NHCH_2)_{n4}\text{---}*'$$

2

$$*\text{---}\underset{H}{\overset{*}{\underset{|}{C}}}\text{---}(C_2H_4O)_{n3}\text{---}(CH_2NHCH_2)_{n4}\text{---}*'$$

3

$$*\text{---}\underset{H}{\overset{*}{\underset{|}{C}}}\text{---}(CH_2O)_{n3}\text{---}(C_2H_4NHCH_2)_{n4}\text{---}*'$$

4

$$*\text{---}\underset{H}{\overset{*}{\underset{|}{C}}}\text{---}(CH_2O)_{n3}\text{---}(CH_2NHC_2H_4)_{n4}\text{---}*'$$

5

$$*\text{---}\underset{H}{\overset{*}{\underset{|}{C}}}\text{---}(C_2H_4O)_{n3}\text{---}(C_2H_4NHCH_2)_{n4}\text{---}*'$$

6

$$*\text{---}\underset{H}{\overset{*}{\underset{|}{C}}}\text{---}(C_2H_4O)_{n3}\text{---}(CH_2NHC_2H_4)_{n4}\text{---}*'$$

7

$$*\text{---}\underset{H}{\overset{*}{\underset{|}{C}}}\text{---}(C_3H_6O)_{n3}\text{---}(CH_2NHCH_2)_{n4}\text{---}*'$$

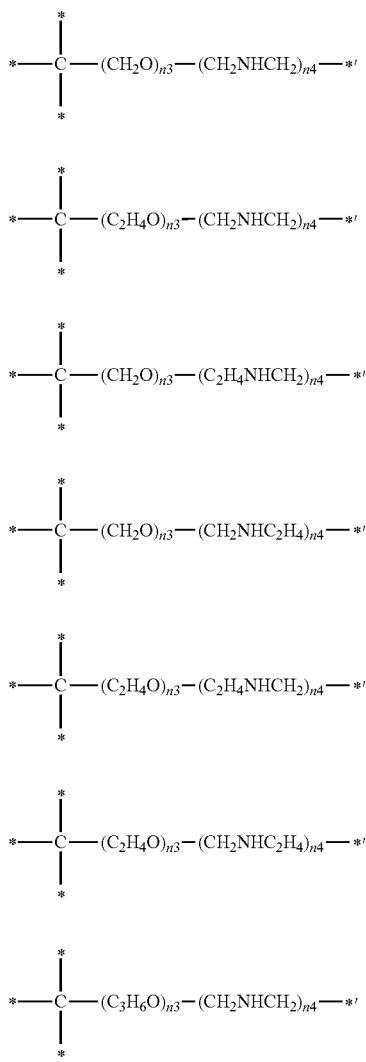

In the moieties 1-14 shown above, * represents a binding site to the top portion, and *' represents a binding site to the end portion.

The alkylene moiety having at least two carbon atoms (e.g., $C_2H_4$, $C_3H_6$) may have a linear or branched structure.

Moieties 1 to 7 are trivalent linking groups and moieties 8-14 are tetravalent linking groups. For example, the linker linking the top portion to the end portion may be a trivalent linking group such as, for example, moiety 1, 2, 3, 4, 5, 6 or 7, or a tetravalent linking group such as, for example, moiety 8, 9, 10, 11, 12, 13 or 14. For example, two perfluoropolyether moieties of the top portion may be connected to the linker which is a trivalent linking group, or three perfluoropolyether moieties of the top portion may be connected to the linker which is a tetravalent linking group.

According to an embodiment of the present disclosure, the end portion may include Si in the number of 1 to 40. For example, the siloxane moiety of the end portion may include Si in the number of 1 to 40.

According to an embodiment of the present disclosure, the end portion may be represented by Formula 3:

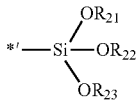

Formula 3 wherein, in Formula 3,
$R_{21}$ to $R_{23}$ may each independently be selected from hydrogen and a $C_1$-$C_5$ alkyl group, and
*' represents a binding site to the linker.

For example, the siloxane moiety of the end portion may be represented by Formula 3.

FIG. 1 shows a schematic view of an anti-fingerprint coating compound according to an embodiment of the present disclosure; and FIG. 1 schematically shows a case in which the top portion includes two perfluoropolyether moieties, the linker is a trivalent linking group, and the end portion is represented by Formula 3. For example, the linker of FIG. 1 may be a trivalent linking group selected from moieties 1-7 described above. For example, the end portion of FIG. 1 may be represented by Formula 3 with each of $R_{21}$, $R_{22}$ and $R_{23}$ being hydrogen.

According to an embodiment of the present disclosure, the end portion may be represented by Formula 4:

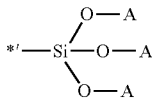

Formula 4 wherein, in Formula 4,
A may be a group represented by Formula 4-1, and
*' represents a binding site to the linker, Formula 4-1

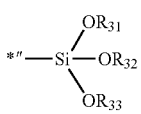

Formula 4-1 wherein, in Formula 4-1,
$R_{31}$ to $R_{33}$ may each independently be selected from hydrogen and a $C_1$-$C_5$ alkyl group, and
*'' denotes a binding site to O.

According to an embodiment of the present disclosure, the end portion may be represented by Formula 5:

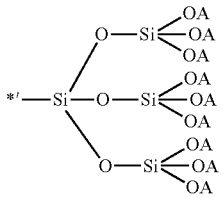

Formula 5 wherein, in Formula 5,
A represents Formula 4-1, and
*' represents a binding site to the linker.

The end portion of the anti-fingerprint coating compound according to an embodiment of the present disclosure may react with a functional group (for example, OH) on the surface of the hard coating layer to be bonded to the hard coating layer while water or alcohol are removed as a byproduct. With multiple Si—O bonds formed between the end portion of the anti-fingerprint coating compound and the surface of the hard coating layer, the bonding strength between the anti-fingerprint coating compound and the hard coating layer may increase, and the wear resistance of the display protective layer may be enhanced.

According to an embodiment of the present disclosure, a display protective layer includes a substrate, a hard coating layer located on the substrate, and an anti-fingerprint coating layer located on the hard coating layer.

The anti-fingerprint coating layer may be a layer coated with anti-fingerprint coating compounds, wherein each anti-fingerprint coating compound includes a top portion, a linker, and an end portion, and the top portion may include two or three perfluoropolyether moieties, the linker linking the top portion to the end portion may be a trivalent or tetravalent linking group, and the end portion may include a siloxane moiety.

In an embodiment of the present disclosure, the display protective layer may be used for a flexible display. For example, the display protective layer according to an embodiment of the present disclosure may have high durability and good wear resistance suitable for use in a foldable display device.

According to an embodiment of the present disclosure, the anti-fingerprint coating layer of the display protective layer is a layer coated with the anti-fingerprint coating compound according to an embodiment of the present disclosure.

According to an embodiment of the present disclosure, the surface of the anti-fingerprint coating layer may have an uneven thickness structure of about 1 nm to about 30 nm in a vertical direction. Since the surface is uneven, the thickness varies depending on the location of the surface.

Since the anti-fingerprint coating layer of the display protective layer according to an embodiment of the present disclosure has the uneven structure, a lotus effect may be obtained. To be described later, in an embodiment of the present disclosure, to increase the lotus effect, the anti-fingerprint coating layer may be deposited after implementing nanoscale roughness on the hard coating layer (see FIG. 3). For example, by including nanoparticles in the hard coating layer, roughness may be realized on the surface of the hard coating layer.

The top portion of the anti-fingerprint coating compound according to an embodiment of the present disclosure includes two or three perfluoropolyether moieties. Due to the inclusion of such number of perfluoropolyether moieties, the density of the alkyl fluoride moieties in the space is increased. As a result, an antifouling property is increased. For example, when the density of the alkyl fluoride moieties in the space increases, the hydrophobicity and the water contact angle of the anti-fingerprint coating layer may increase.

According to an embodiment of the present disclosure, the hard coating layer and the anti-fingerprint coating layer of the display protective layer may be in contact with each other, a surface of the hard coating layer in contact with the anti-fingerprint coating layer may have a flat structure, linkers of the anti-fingerprint coating compounds may have different lengths, and a length difference among linkers may be from about 1 nm to about 30 nm. In an embodiment of the present disclosure, the length difference of linkers may be from about 5 nm to about 10 nm. In an embodiment of the present disclosure, the length difference of linkers may be from about 8 nm to about 12 nm. In an embodiment of the present disclosure, the length difference of linkers may be from about 10 nm to about 20 nm. In an embodiment of the present disclosure, the length difference of linkers may be from about 15 nm to about 25 nm. In an embodiment of the present disclosure, the length difference of linkers may be from about 20 nm to about 30 nm.

FIG. 2 is a schematic view of an anti-fingerprint coating layer having an uneven surface which is formed by coating an anti-fingerprint coating compound according to an embodiment of the present disclosure on a hard coating layer having a flat surface (the end portion is omitted). This drawing schematically illustrates two different kinds of the anti-fingerprint coating compounds according to an embodiment of the present disclosure having different lengths which are deposited as two sources on a flat hard coating layer by using an e-beam. However, the present disclosure is not limited thereto. For example, in an embodiment of the present disclosure, three or more different kinds of the anti-fingerprint coating compounds having different lengths may be deposited on the flat hard coating layer using an e-beam.

The anti-fingerprint coating compound having different lengths according to an embodiment of the present disclosure may be prepared by changing the length of the top portion, the linker, or the end portion.

Since the top portion is not aligned accurately vertically. Accordingly, as the manner to allow the anti-fingerprint coating layer to have an uneven surface, the changing of the length of the top portion is not effective.

The increase in the number of Si atoms in the siloxane moiety at the end portion may be considered. Likewise, however, the direction in which Si is increased in the number is not an accurate vertical direction. Accordingly, as the manner to allow the anti-fingerprint coating layer to have an uneven surface, the changing of the length of the end portion is not effective. The effect of increasing the number of Si atoms in the siloxane moiety at the end portion is an increased adhesion with the hard coating layer.

Since the linker may be aligned vertically, changing the length of the linker may be effective in changing the anti-fingerprint coating layer from a flat surface to an uneven surface.

By changing the length of the linker, the anti-fingerprint coating compound according to an embodiment of the present disclosure may be prepared to have different lengths, and by using the different lengths of the anti-fingerprint coating compound, the anti-fingerprint coating layer may be allowed to have an uneven surface.

According to an embodiment of the present disclosure, the hard coating layer contacts the anti-fingerprint coating layer, the surface of the hard coating layer in contact with the anti-fingerprint coating layer may have an uneven structure, and the linkers of the anti-fingerprint coating compounds may be a trivalent or tetravalent linking group having a certain length. The certain length used herein refers to the arbitrary same length. In other words, due to uneven surface of the hard coating layer, although the anti-fingerprint coating compounds may have the same length, the anti-fingerprint coating layer has an uneven surface.

According to an embodiment of the present disclosure, the hard coating layer may have an uneven surface structure by applying any uneven structure forming method. In an embodiment of the present disclosure, the uneven structure forming method may be a method by nano imprinting, a method using nanoparticles, or the like.

FIG. 3 is a schematic view of an anti-fingerprint coating layer having an uneven surface which is formed by coating an anti-fingerprint coating compound according to an embodiment of the present disclosure on a hard coating layer having an uneven surface (the end portion is omitted).

According to an embodiment of the present disclosure, nanoparticles may be introduced into the hard coating layer to allow a surface of the hard coating layer to have an uneven structure. The diameter of the nanoparticles may be from about 1 nm to about 30 nm. In an embodiment of the present disclosure, the diameter of the nanoparticles may be from about 5 nm to about 10 nm. In an embodiment of the present disclosure, the diameter of the nanoparticles may be from about 8 nm to about 12 nm. In an embodiment of the present disclosure, the diameter of the nanoparticles may be from about 10 nm to about 20 nm. In an embodiment of the present disclosure, the diameter of the nanoparticles may be from about 15 nm to about 25 nm. In an embodiment of the present disclosure, the diameter of the nanoparticles may be from about 20 nm to about 30 nm.

When nanoparticles corresponding to a desired level of unevenness are used in forming the hard coating layer, and the anti-fingerprint coating compounds has the same length, the formed anti-fingerprint coating layer has the uneven surface. Due to the uneven surface, the anti-fingerprint coating layer may have an increased lotus effect.

A material for the nanoparticles is not particularly limited, but may have a diameter corresponding to the uneven surface of the anti-fingerprint coating layer.

According to an embodiment of the present disclosure, the substrate may be glass as well as a polymer film.

The polymer film may include, for example, polyethylene terephthalate (PET), polyethylene naphthalate (PEN), or polyimide (PI).

The glass may be, for example, rigid glass, thin-glass, or ultra-thin glass.

According to an embodiment of the present disclosure, the substrate may have a thickness of about 10 µm to about 70 µm.

In an embodiment of the present disclosure, the substrate may have a thickness of about 20 µm to about 60 µm.

The hard coating layer may be located on the substrate. According to an embodiment of the present disclosure, the hard coating layer may have a thickness of about 2 µm to about 8 µm. In an embodiment of the present disclosure, the hard coating layer may have a thickness of about 3 µm to about 7 µm.

The anti-fingerprint coating layer may be located on the hard coating layer. According to an embodiment of the present disclosure, the anti-fingerprint coating layer may have a thickness of about 5 nm to about 100 nm. According to an embodiment of the present disclosure, the anti-fingerprint coating layer may have a thickness of about 10 nm to about 70 nm.

When protection of a display device, for example, a light-emitting device, which is an objective of the display protective layer is considered, the thickness of each of the substrate, the hard coating layer, and the anti-fingerprint coating layer in the display protective layer may be within these ranges. The light-emitting device may include, for example, an organic light-emitting display device (OLED) and/or a quantum dot light-emitting display device (QLED), but the present disclosure is not limited thereto. For example, in an embodiment of the present disclosure, the display protective layer may be used for protecting the surface of various image displays which may include, for example, a liquid crystal display device (LCD), an electroluminescence (EL) display, a plasma display (PD), and a field emission display (FED). Also, when the thickness of each of the substrate, the hard coating layer, and the anti-fingerprint coating layer in the display protective layer is within these ranges, the display protective layer may be used in a flexible display. For example, the display protective layer according to an embodiment of the present disclosure may have high durability and good wear resistance suitable for use in a foldable display device.

According to an embodiment of the present disclosure, the hard coating layer may include an acrylate-based compound, for example, urethane acrylate, or a polyester acrylate-based polymer.

Components of the anti-fingerprint coating layer such as fluorine and silicon may also be contained in the hard coating layer. According to an embodiment of the present disclosure, the hard coating layer may include a polymer including a fluorine group or a silicon group. In an embodiment of the present disclosure, the hard coating layer may include a polymer including a fluorine group. In an embodiment of the present disclosure, the hard coating layer may include a polymer including a silicon group. In an embodiment of the present disclosure, the hard coating layer may include a polymer including a fluorine group and a silicon group.

The hard coating layer may include a polymer including a fluorine group. According to an embodiment of the present disclosure, the hard coating layer may include a polymer including a perfluoropolyether moiety, a polytetrafluoroethylene moiety, a fluorinated ethylene propylene moiety, a perfluoroalkyl vinyl ether moiety, or any combination thereof.

The hard coating layer may include a polymer including a silicon group. According to an embodiment of the present disclosure, the hard coating layer may include a polysiloxane polymer. In an embodiment of the present disclosure, the polysiloxane polymer may be a typical organopolysiloxane polymer. In the organopolysiloxane polymer, an organic group binds to a silicon portion that does not bind to oxygen. In an embodiment of the present disclosure, the organopolysiloxane polymer may be dimethylpolysiloxane (including 1% to 1.5% of a vinyl group), polymethylphenylsiloxane (including 1% to 1.2% of a vinyl group), a poly(vinylmethyl-dimethylsiloxane) copolymer, or a combination thereof.

The hard coating layer may include a polymer including a fluorine group. In an embodiment of the present disclosure, in the case of the hard coating layer, a urethane acrylate or polyester acrylate-based polymer is used as a base, and a perfluoropolyether moiety, a polytetrafluoroethylene moiety, a fluorinated ethylene propylene moiety, a perfluoroalkyl vinyl ether moiety, or any combination thereof is additionally used, and the resultant structure is cured to obtain the coating layer.

The hard coating layer may include a polymer including a silicon group. In an embodiment of the present disclosure, the hard coating layer may be a polymer including: a urethane acrylate or polyester acrylate-based polymer as a base; and dimethylpolysiloxane (including 1% to 1.5% of a vinyl group), polymethylphenylsiloxane (including 1% to 1.2% of a vinyl group), a poly(vinylmethyl-dimethylsiloxane) copolymer, or a combination thereof.

According to an embodiment of the present disclosure, the hard coating layer may include a perfluoropolyether moiety, a polytetrafluoroethylene moiety, a fluorinated ethylene propylene moiety, a perfluoroalkyl vinyl ether moiety, or any combination thereof, in an amount of 50 wt % or less based on the total weight of the polymer. In an embodiment of the present disclosure, the hard coating layer may include a perfluoropolyether moiety, a polytetrafluoroethylene moiety, a fluorinated ethylene propylene moiety, a perfluoroalkyl vinyl ether moiety, or any combination thereof, in an amount of about 5 wt % to about 30 wt % based on the total weight of the polymer.

In an embodiment of the present disclosure, the hard coating layer may include 50 wt % or less of the organopolysiloxane polymer based on the total weight of the polymer. In an embodiment of the present disclosure, the hard coating layer may include about 5 wt % to about 30 wt % of the organopolysiloxane polymer based on the total weight of the polymer. The organopolysiloxane polymer is not particularly limited, and may be any material that generally known. Since the hard coating layer includes a polymer including a fluorine group or a silicon group, the hard coating layer retains antifouling performance even after the anti-fingerprint coating layer is worn out or cracks.

According to an embodiment of the present disclosure, an electronic apparatus may include a display protective layer according to an embodiment of the present disclosure. In an embodiment of the present disclosure, the electronic apparatus may include, for example, an organic light-emitting display device (OLED) and/or a quantum dot light-emitting display device (QLED). For example, the organic light-emitting display device (OLED) may be applied to the electronic apparatus. In an embodiment of the present disclosure, the electronic apparatus may be a foldable display device.

Definition of Terms

The term "$C_1$-$C_{60}$ alkyl group" as used herein refers to a linear or branched aliphatic hydrocarbon monovalent group that has one to sixty carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The $C_2$-$C_{60}$ heteroalkyl group used herein refers to an alkyl group in which the above-described alkyl group includes a hetero element. The hetero element may be, for example, N, S, O, P, or any combination thereof. The $C_2$-$C_{60}$ heteroalkylene group as used herein refers to a divalent group having the same structure as the $C_2$-$C_{60}$ heteroalkyl group.

The maximum number of carbon atoms in this substituent definition section is an example only. In an embodiment of the present disclosure, the maximum carbon number of 60 in the $C_1$-$C_{60}$ alkyl group is an example, and the definition of the alkyl group is equally applied to a $C_1$-$C_{20}$ alkyl group. Other cases are the same.

The spatially relative terms "below", "beneath", "lower", "above" and "upper" may be used to easily describe a relationship between one element or component and another element or component as illustrated in the drawings. It should be understood that spatially relative terms are intended to encompass different directions of a device in use or operation in addition to the direction depicted in the figures. For example, when a device illustrated in the drawing is turned over, a device described as "below" or "beneath" may be placed "above" another device. Accordingly, the term "below" may include both the downward direction and the upward direction. The device may be oriented in other directions, and thus spatially relative terms may be interpreted according to the orientation.

* and *' as used herein, unless defined otherwise, each refers to a binding site to a neighboring atom in a corresponding formula.

Hereinafter, a light-emitting device according to an embodiment of the present disclosure will be described in detail with reference to Examples.

EXAMPLES

Manufacture of Display Protective Layer

Example 1

A display protective layer was manufactured as follows.
First, a 40 μm-thick PET layer was formed as a substrate, and subsequently, urethane acrylate and fluorinated ethylene propylene were ultraviolet (UV)-cured to form a 5 μm-thick hard coating layer (25 wt % of fluorinated ethylene propylene) on the substrate.

On the hard coating layer, a 30 nm-thick anti-fingerprint coating layer was formed by using Compounds A and B as two sources and an e-beam.

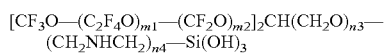

Compound A: m1=3, m2=2, n3=1, and n4=1
Compound B: m1=3, m2=2, n3=4, and n4=4

Example 2

A display protective layer was manufactured as follows.
A 40 μm-thick PET layer was formed as a substrate, then 7 nm diameter nano bead particles were placed thereon, and subsequently, urethane acrylate and fluorinated ethylene propylene were UV-cured to form a hard coating layer having a thickness of 5 μm (25 wt % of fluorinated ethylene propylene) on the substrate.

An anti-fingerprint coating layer having a thickness of 30 nm was formed on the hard coating layer by using Compound A, as a single source, and an e-beam.

Example 3

A display protective layer was manufactured as follows.
First, a 40 μm-thick PET layer was formed as a substrate, and subsequently, urethane acrylate and perfluoroalkyl vinyl ether were ultraviolet (UV)-cured to form a 5 μm-thick hard coating layer (25 wt % of perfluoroalkyl vinyl ether) on the substrate.

On the hard coating layer, a 30 nm-thick anti-fingerprint coating layer was formed by using Compounds C and D as two sources and an e-beam.

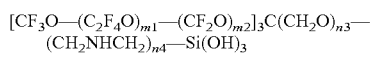

Compound C: m1=2, m2=1, n3=1, and n4=1
Compound D: m1=2, m2=1, n3=4, and n4=4

Example 4

A display protective layer was manufactured as follows.
A 40 μm-thick PET layer was formed as a substrate, then 7 nm diameter nano bead particles were placed thereon, and subsequently, urethane acrylate and perfluoroalkyl vinyl ether were UV-cured to form a hard coating layer having a thickness of 5 μm (25 wt % of perfluoroalkyl vinyl ether) on the substrate.
An anti-fingerprint coating layer having a thickness of 30 nm was formed on the hard coating layer by using Compound C, as a single source, and an e-beam.

Example 5

A display protective layer was manufactured as follows.
First, a 40 μm-thick layer of PET was formed as a substrate, and then urethane acrylate and dimethylpolysiloxane (including 1% to 1.5% of vinyl group) were UV-cured to form a 5 μm-thick hard coating layer (25 wt % of dimethylpolysiloxane) on the substrate.
On the hard coating layer, a 30 nm-thick anti-fingerprint coating layer was formed by using Compounds A and B, as two sources, and an e-beam.

Comparative Example 1

A display protective layer was manufactured as follows.
First, a 40 μm-thick PET layer was formed as a substrate, and subsequently, urethane acrylate was UV-cured to form a 5 μm-thick hard coating layer on the substrate.
An anti-fingerprint coating layer having a thickness of 30 nm was formed on the hard coating layer by using Compound A, as a single source, and an e-beam.

Evaluation Example

Wear Resistance Measurement

An eraser was placed on each of the display protective layers manufactured according to Examples 1 to 5, and reciprocated several times under a load of 1 Kg. Then, a water contact angle of each of the display protective layers was measured. Results thereof are shown in Table 1.

TABLE 1

| | Number of reciprocations | Water contact angle (°) |
| --- | --- | --- |
| Example 1 | 5,000 | 115.7 |
| Example 2 | 10,000 | 108.4 |
| Example 3 | 5,000 | 118.4 |
| Example 4 | 10,000 | 109.1 |
| Example 5 | 10,000 | 107.2 |
| Comparative Example 1 | 5,000 | 100.2 |
| Comparative Example 1 | 10,000 | 95.1 |

When the water contact angle is 95° or more, the antifouling property is considered as being excellent. Generally, if the water contact angle is larger than 90°, the solid surface is considered as hydrophobic. In other words, the display protective layers having high hydrophobicity with contact angles greater than 95° will have excellent antifouling property.

The display protective layers according to an embodiment of the present disclosure exhibit better antifouling properties than that of Comparative Example 1. This result is because the anti-fingerprint layer of the display protective layer according to Comparative Example 1 does not have an uneven structure, but the anti-fingerprint layer of the display protective layer according to an embodiment of the present disclosure has an uneven structure. The uneven structure of the anti-fingerprint layer of the display protective layer according to an embodiment of the present disclosure is created by simultaneously depositing anti-fingerprint coating compounds having two types of chain length as exhibited in Examples 1, 3 and 5, or created by introducing 7 nm diameter nano bead particles into the hard coating layer to allow a surface of the hard coating layer to have an uneven surface followed by depositing anti-fingerprint coating compounds having one type of chain length as exhibited in Examples 2 and 4.

It can be seen that Examples 2, 4, and 5 show water contact angles significantly greater than those of Comparative Example 1 under the same test condition in which the number of reciprocations was 10,000. This is because even after the anti-fingerprint coating layer is partially worn out or partially cracks, due to the inclusion of a polymer including a fluorine group or a silicon group in the hard coating layer of the display protective layer according to an embodiment of the present disclosure, the hard coating layer retains excellent antifouling performances.

In Comparative Example 1, the water contact angles at 5,000 and 10,000 reciprocations were all 95° or more, which indicates high antifouling properties. However, as the number of reciprocations is increased, the water contact angle was relatively small. This is because the hard coating layer exposed after the anti-fingerprint coating layer is partially worn out or cracks, has relatively weak antifouling performances. In other words, the exposed hard coating layer in Comparative Example 1 does not have a polymer including a fluorine group or a silicon group, and thus has relatively weak antifouling performances.

The display protective layer using the anti-fingerprint coating compound according to an embodiment of the present disclosure has excellent wear resistance and antifouling properties.

It should be understood that embodiments described herein should be considered in a descriptive sense only and not for purposes of limitation. Descriptions of features or aspects within each embodiment should typically be considered as available for other similar features or aspects in other embodiments. While specific embodiments have been described with reference to the figures, it will be understood by those of ordinary skill in the art that various changes in form and details may be made therein without departing from the spirit and scope of the present disclosure as defined by the appended claims.

What is claimed is:

1. An anti-fingerprint coating compound comprising a top portion, a linker, and an end portion, wherein
the top portion includes two or three perfluoropolyether moieties,
the linker linking the top portion to the end portion is a trivalent or tetravalent linking group,
the end portion includes a siloxane moiety or a trialkoxysilane moiety, and the linker is represented by Formula 2:

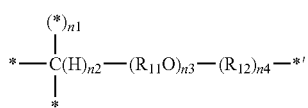

Formula 2 wherein, in Formula 2, $R_{11}$ represents a $C_1$-$C_{60}$ alkylene group, and $R_{12}$ represents a $C_2$-$C_{60}$ heteroalkylene group, n1 and n2 each independently represents an integer of 0 or 1, and sum of n1 and n2 is 1, n3 and n4 each independently represents an integer from 1 to 10, when n3 is 2 or more, respective $R_{11}$'s are identical to or different from each other, when n4 is 2 or more, respective $R_{12}$'s are identical to or different from each other,

* represents a binding site to the top portion, and

*' represents a binding site to the end portion.

2. The anti-fingerprint coating compound of claim 1, wherein the two or three perfluoropolyether moieties are each represented by Formula 1:

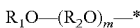

Formula 1 wherein, in Formula 1, $R_1$ represents a branched or linear $C_1$-$C_{60}$ alkyl group substituted with F, and $R_2$ represents a branched or chain $C_1$-$C_{60}$ alkylene group substituted with F, m represents an integer from 1 to 20, when m is 2 or greater, respective $R_2$'s are identical to or different from each other, and

* denotes a binding site to the linker.

3. The anti-fingerprint coating compound of claim 1, wherein the $C_2$-$C_{60}$ heteroalkylene group includes S, O, P, N, or any combination thereof.

4. The anti-fingerprint coating compound of claim 1, wherein the end portion includes 1 to 40 Si atoms.

5. The anti-fingerprint coating compound of claim 1, wherein the end portion is represented by Formula 3:

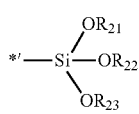

Formula 3 wherein, in Formula 3, $R_{21}$ to $R_{23}$ are each independently selected from hydrogen and a $C_1$-$C_5$ alkyl group, and

*' represents a binding site to the linker.

6. The anti-fingerprint coating compound of claim 1, wherein the end portion is represented by Formula 4:

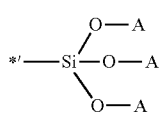

Formula 4 wherein, in Formula 4, A is a group represented by Formula 4-1, and

*' represents a binding site to the linker,

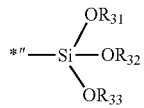

Formula 4-1 wherein, in Formula 4-1, $R_{31}$ to $R_{33}$ are each independently selected from hydrogen and a $C_1$-$C_5$ alkyl group, and

*" represents a binding site to O.

7. The anti-fingerprint coating compound of claim 1, wherein the end portion is represented by Formula 5:

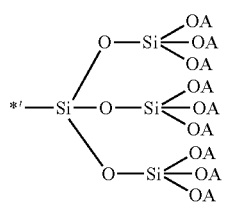

Formula 5 wherein, in Formula 5, A is a group represented by Formula 4-1, and

*' represents a binding site to the linker,

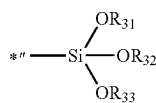

Formula 4-1 wherein, in Formula 4-1, $R_{31}$ to $R_{33}$ are each independently selected from hydrogen and a $C_1$-$C_5$ alkyl group, and

*" represents a binding site to O.

8. A display protective layer comprising:

a substrate;

a hard coating layer located on the substrate; and an anti-fingerprint coating layer located on the hard coating layer, wherein the anti-fingerprint coating layer is a layer comprising anti-fingerprint coating compounds, each including a top portion, a linker, and an end portion, the top portion includes two or three perfluoropolyether moieties, the linker linking the top portion to the end portion is a trivalent or tetravalent linking group, and the end portion includes a siloxane moiety, the hard coating layer and the anti-fingerprint coating layer are in contact with each other, a surface of the hard coating layer in contact with the anti-fingerprint coating layer is flat, and the linkers of the anti-fingerprint coating compounds have different lengths, and a length difference among the linkers is from about 1 nm to about 30 nm.

9. The display protective layer of claim 8, wherein a surface of the anti-fingerprint coating layer has an uneven structure having a thickness of about 1 nm to about 30 nm in a vertical direction.

10. The display protective layer of claim 8, wherein the hard coating layer has a thickness of about 2 μm to about 8 μm.

11. The display protective layer of claim 8, wherein the anti-fingerprint coating layer has a thickness of about 5 nm to about 100 nm.

12. The display protective layer of claim 8, wherein the hard coating layer includes a polymer which contains at least one of a fluorine-containing group and a silicon-containing group.

13. The display protective layer of claim 8, wherein the hard coating layer includes a polymer including a perfluoropolyether moiety, a polytetrafluoroethylene moiety, a fluorinated ethylene propylene moiety, a perfluoroalkyl vinyl ether moiety, or any combination thereof.

14. The display protective layer of claim 8, wherein the hard coating layer comprises a polysiloxane polymer.

15. An electronic apparatus comprising:
a display protective layer which comprises:
a substrate;
a hard coating layer located on the substrate; and
an anti-fingerprint coating layer located on the hard coating layer,
wherein the anti-fingerprint coating layer is a layer comprising anti-fingerprint coating compounds, each including a top portion, a linker, and an end portion, and
the top portion includes two or three perfluoropolyether moieties, the linker linking the top portion to the end portion is a trivalent or tetravalent linking group, and the end portion is represented by Formula 4 or Formula 5:

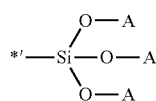

Formula 4

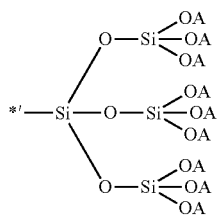

Formula 5 wherein, in Formula 4 or Formula 5, A is a group represented by Formula 4-1, and
*' represents a binding site to the linker,

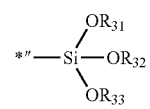

Formula 4-1 wherein, in Formula 4-1, $R_{31}$ to $R_{33}$ are each independently selected from hydrogen and a $C_1$-$C_5$ alkyl group, and
*''' represents a binding site to O.

16. The electronic apparatus of claim 15, wherein an organic light-emitting display device is applied to the electronic apparatus.

17. The electronic apparatus of claim 15, wherein the linkers of the anti-fingerprint coating compounds have different lengths, or a surface of the hard coating layer contacting the anti-fingerprint coating layer has an uneven structure formed using nanoparticles.

18. The electronic apparatus of claim 17, wherein the linkers of the anti-fingerprint coating compounds of the anti-fingerprint coating layer contacting the uneven structure have the same length.

19. The electronic apparatus of claim 17, wherein a diameter of the nanoparticles is from about 1 nm to about 30 nm.

* * * * *